United States Patent [19]

Kajiwara et al.

[11] Patent Number: 4,740,866
[45] Date of Patent: Apr. 26, 1988

[54] SEALED-TYPE LIQUID COOLING DEVICE WITH EXPANDABLE BELLOW FOR SEMICONDUCTOR CHIPS

[75] Inventors: Ryoichi Kajiwara; Takao Funamoto; Mitsuo Katoo; Tomohiko Shida; Takeshi Matsuzaka; Hiroshi Wachi, all of Hitachi; Kazuya Takahashi, Katsuta, all of Japan

[73] Assignee: Hitachi, Ltd., Tokyo, Japan

[21] Appl. No.: 843,623

[22] Filed: Mar. 25, 1986

[30] Foreign Application Priority Data

Mar. 26, 1985 [JP] Japan .................................. 60-59653

[51] Int. Cl.<sup>4</sup> ............................................. H05K 7/20
[52] U.S. Cl. ..................... 361/382; 357/82; 165/80.4
[58] Field of Search ...................... 361/385, 384, 382; 357/82, 81; 165/185, 80.4; 205/226, 229; 92/46, 45

[56] References Cited

U.S. PATENT DOCUMENTS

| | | | |
|---|---|---|---|
| 3,653,690 | 4/1972 | Treveiler et al. | 285/226 |
| 3,796,103 | 3/1974 | Winfield, Jr. | 285/226 X |
| 4,484,772 | 11/1984 | Ross, Jr. et al. | 285/226 |

Primary Examiner—J. R. Scott
Assistant Examiner—A. Jonathan Wysocki
Attorney, Agent, or Firm—Antonelli, Terry & Wands

[57] ABSTRACT

A semiconductor module cooling structure comprises a housing having a passage through which a cooling fluid flows; a cooling block to which the cooling fluid is supplied from the housing and which has an electrical insulating layer at the bottom portion and is combined with a semiconductor chip through the electrical insulating layer; and a bellows which is connected between the housing and the cooling block. The cooling fluid is supplied to the cooling block through the bellows. The bellows is formed in a manner such that a plurality of substantially plane ring-like metal plates are laminated, pressed, diffused, joined, and thereafter stretched and molded.

9 Claims, 9 Drawing Sheets

FIG. IIA

FIG. IIB

SEALED-TYPE LIQUID COOLING DEVICE WITH EXPANDABLE BELLOW FOR SEMICONDUCTOR CHIPS

BACKGROUND OF THE INVENTION

The present invention relates to a sealed type liquid cooling apparatus which can individually cool each chip in a semiconductor multichip module in which a plurality of semiconductor chips are attached on a multilayer wiring board and, more particularly, to a cooling structure including a plurality of expandable microbellows.

Figure 1:
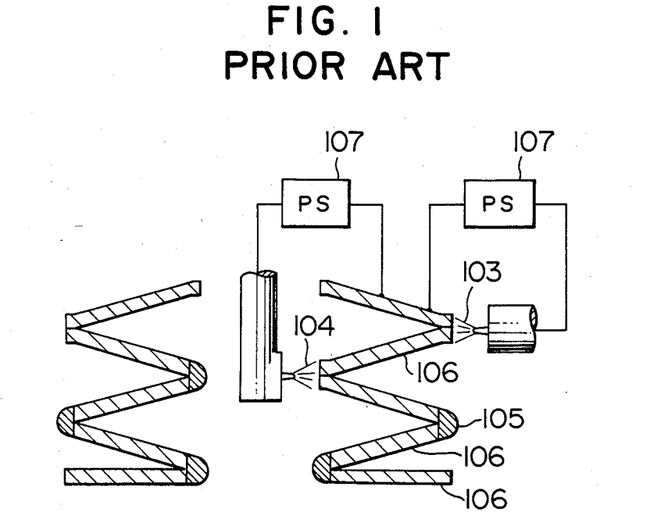
FIGS. 1 and 2 are diagrams showing the conventional technology.
Figure 2:
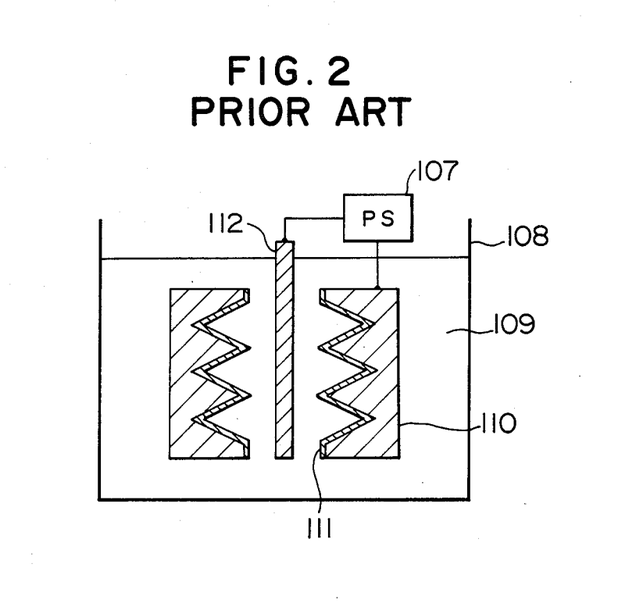

Hitherto, with an increase in degree of integration of semiconductor electronic circuit, an amount of heat which is generated from one semiconductor chip has increased more and more and in order to cope with this increase in the heat generation, new means for cooling the chips having an excellent cooling efficiency has been studied. Particularly, for the high speed data processing apparatus such as a computer in which the heat generation amount of the chip exceeds ten watts and it is necessary to severely manage the operating temperature range of the chip, the cooling apparatus using the liquid as disclosed in, e.g., U.S. Pat. No. 4,138,692 has been proposed. In such a kind of apparatus, to reduce the thermal resistance from the semiconductor chip to the cooling medium, it is necessary to couple them by a high thermal conductivity material. At the same time, since the heights and angles of inclination of the respective chips differ due to the deformation of the substrate or unevenness of soldering, it is necessary to provide the expandable movable part in the connecting portion to thermally couple the piping system to supply the cooling medium with the semiconductor chip. As a structure of the movable part, it is considered that the bellows is the most flexible optimum structure as frequently seen in vacuum vessels or the like. As shown in FIG. 1, as a method of manufacturing the bellows, it is considered to arc-weld or braze respective bellows component parts 106 injunctions 105 by use of arcs 103 and 104. However, in the actual high speed data processing apparatus, nearly one hundred semiconductor chips are attached to a square substrate in which a length of each side is 100 mm. Therefore, even if one cooling block is connected for one chip and at least one bellows is attached thereto, the size of outer diameter becomes below 10 mm, so that according to the conventional technology, the microbellows can be formed by only an electroplating method as shown in FIG. 2. In FIG. 2, reference numeral 107 denotes a power source; 108 is a plating bath; 109 a plating fluid; 110 an original mold; 111 a plated film; and 112 a plating electrode. The shape of the electroforming bellows manufactured by the electroplating method has a limitation, so that the number of mountains per unit length cannot be increased and the plated film quality becomes hard. Consequently, only the bellows having a high spring constant can be produced. On the other hand, in the junction between the piping system and the bellows or between the bellows and the cooling block, a pressure cannot be applied to the junction surfaces in terms of the structure of the electroforming bellows, so that the junction can be made by only the brazing means due to the replaced brazing. However, according to the brazing, a flux must be used to improve thermal flowout of a brazing material and wettability and thereby to improve junction property. Thus, if the residue remains, there will be a significant adverse influence on the corrosion. In addition, defects are likely to occur in the brazing, portion and the reliability for airtightness also will be lacking. Further, the structural material and brazing material cannot have the same composition, so that in the case where the water is used as the cooling fluid, electrochemical corrosion occurs near the boundary between the structural material and the brazing material layer and there is the problem such that the corrosion resistance significantly deteriorates. On the other hand, a Kovar material is generally used as a material of the housing or cooling block in consideration of the thermal expansion difference between this material and SiC ceramics which are used as a multilayer wiring board or electrical insulation layer of the cooling block. However, as a bellows material as well, it is desirable to use the Kovar material of the same quality in terms of the electrochemical corrosion. However, it is difficult to produce the bellows made of alloy according to the conventional electroplating method and there is the problem such that the bellows material is limited to the pure metal such as Ni. Further, in the case of assembling the cooling structure using the electroforming bellows, about a hundred of bellows must be brazed to the housing in which a length of each side is about 100 mm and the piping system is built therein, so that it takes a long time to set the bellows, brazing material, consequently flux and the productivity deteriorates.

SUMMARY OF THE INVENTION

It is an object of the present invention to provide a structure in a semiconductor module cooling structure in a high speed data processing apparatus such as a computer or the like, wherein it is possible to easily assemble and manufacture the complicated cooling structure which can cool a plurality of LSI chips highly efficiently and also includes the flexible bellows such as not to apply an external force to each LSI chip.

Another object of the invention is to provide a cooling structure in which the material of the cooling structure and the corrosion resistances of a number of joint portions are improved.

The present invention relates to the semiconductor module cooling structure and will be summarized as follows. Namely, this cooling structure comprises: a housing formed with passages to supply and drain the cooling fluid; a cooling block which is metallically joined with semiconductor chips and having an electrical insulation layer in the bottom portion; and bellows for airtightly and flexibly coupling the housing with the cooling block, wherein this bellows is the joint bellows which is obtained by subjecting the thin ring-like plates to the works including the pressure joining process.

As mentioned above, the bellows according to the invention has the zigzag shape and is formed in a manner such that thin ring-like plates are laminated and joined with a pressure and the laminated plates are extended and molded.

DESCRIPTION OF THE PREFERRED EMBODIMENTS

Figure 3:
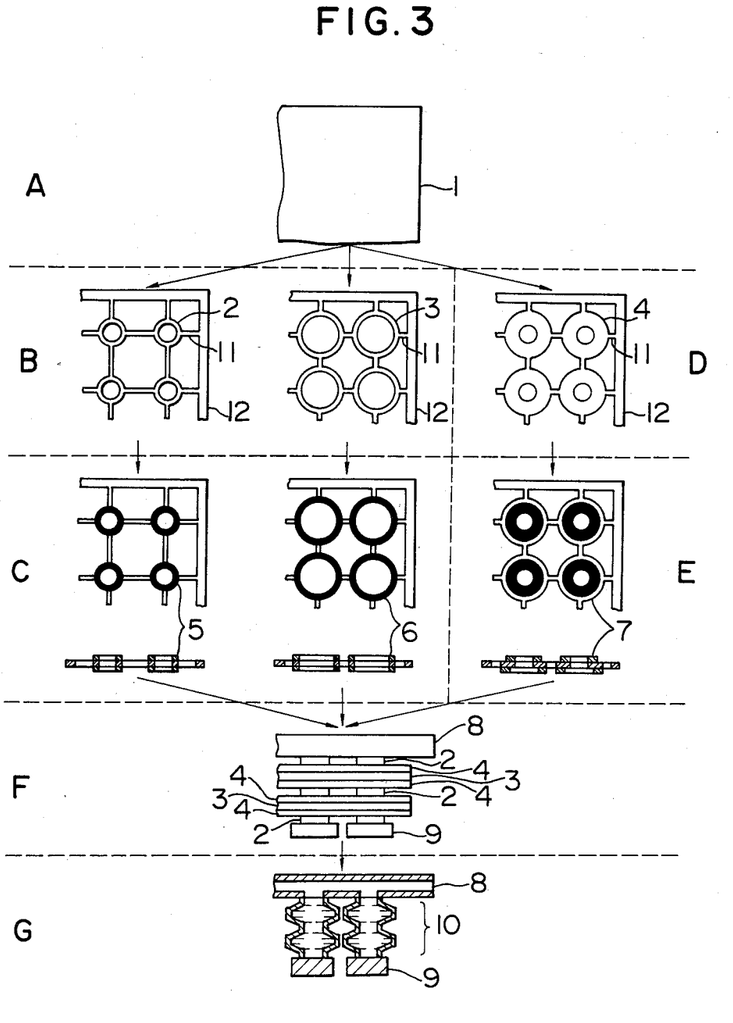
FIG. 3 is a diagram showing a procedure of a method of manufacturing a cooling structure according to the present invention.

Referring now to FIG. 3, reference numeral 1 denotes a thin plate; 2 and 3 are junction rings; 4 bellows rings; 5 and 6 junction films; 7 junction preventing films; 8 a housing; 9 cooling blocks; 10 bellows; 11 bridges; and 12 a frame. The thin plate 1 is made of Ni, Fe-Ni-Co alloy, stainless steel, titanium alloy (containing mainly titanium and palladium of 0.01 to 2 weight %), or the like having high corrosion resistance as a bellows material. From this thin plate 1, the bellows rings 4, outer peripheral junction rings 3, and inner peripheral junction rings 2 are patterned and worked due to an etching method. In this case, as shown in step B, the respective parts are fixed to the frame 12 by the bridges 11 so as not to be separated. The sizes or layout of the bellows are determined in consideration of the heat generation amount or arrangement of each LSI chip in the semiconductor module which is cooled. Next, the alloy of which boron and/or silicon was added to the pure metal or alloy of the element constituting the base material is formed as a joining alloy film onto both sides of each of the junction rings 2 and 3 so as to have a thickness below a few microns by a physical deposition method or plating method. On the other hand, an inorganic material of the oxide, nitride, or carbide system such as, for example, the material of which ceramics having yttria ($Y_2O_3$) of seven weight % having a thickness of one micron was coated onto zirconia, ($ZrO_2$) by a sputtering method, which is unreactive to the metal of the bellows material and chemically stable at the junction temperature, is coated as the junction preventing films 7 onto the portions of the bellows rings which are not joined due to method in combination of a PVD or CVD and a dry etching, lift-off method, method whereby the PVD is performed after performing the metal masking, or the like. Next, the inner peripheral junction rings 2 are detached from the bridges 11 and as many as the necessary number of bellows part 2, 3 and 4 are laminated between the housing 8 and the cooling blocks 9 with the outer peripheral junction rings 3 and bellows rings 4 fixed to the frame 12 as shown in process F. Then, the pressure of several grammes per $mm^2$ to several Kilogrammes per $mm^2$ is applied under vacuum or inert ambient atmosphere and the temperature is raised to above 1100° C., thereby joining those parts. After completion of the joint, the bridges 11 and frame 12 connected to the bellows parts are cut and removed as necessary and then the bellows are stretched and molded.

The above-mentioned process is an example. Therefore, the semiconductor module cooling structure of the invention includes various kinds of embodiments as shown hereinafter.

A feature of the first embodiment of the invention relates to a structure of the cooling structure which is assembled in the following manner. Namely, a plurality of plates on each of which the bellows parts were patterned due to a photo etching or the like are prepared. A plurality of other plates in each of which, for instance, grooves or holes were formed and which constitute the housing and cooling blocks are also prepared. A number of those plates are simultaneously laminated and joined with a pressure, thereby assembling the cooling structure. Consequently, it is possible to easily assemble by the simple process the complicated cooling structure in which a number of high deformable microbellows are connected to the housing. In addition, the microbellows which could conventionally be produced by only the plating method are assembled due to the pressure joining method. Therefore, the same material as those of the housing and cooling blocks can be selected as the material of the bellows. The reliability of the joint can be raised.

A feature of the second embodiment of the invention is as follows. The alloy which is obtained by adding at least one or more kinds of silicon (Si) or boron (B) to the base material is formed like a thin film having the thickness of, e.g., below 10 μm. This alloy is joined as an alloy film having a low melting point to the joint portion at joint temperatures above the melting point of the alloy having a low melting point. In this manner, the cooling structure is assembled. Due to this, the joint having a high airtightness can be obtained even at a low joint pressure thereby enabling the deformation of the parts to be prevented. In addition, since the alloy film is thinly formed, the additional element such as Si or B is easily diffused and extinguished into the base material and the quality of the junction layer is uniformed with that of the base material. Thus, the corrosion resistance of the joint portion is remarkably improved.

A feature of the third embodiment of the invention is that the sizes of bellows or cooling blocks corresponding to the LSI chips are set to various different values depending on the amounts of heat generation of the chips. Consequently, the temperature of each LSI chip can be held within a special temperature range at which the LSI chip can stably operate at the highest speed.

A feature of the fourth embodiment of the invention is that the thin plate having the same shape as the joint surface and the same material as the structural material is inserted into the joint portion and joined. Consequently, in the case where the size of cooling structure to be assembled is enlarged as well, the pressure can be concentrated to the joint surface, so that the total pressure to be applied can be reduced and the apparatus can be miniaturized and the reliability of the junction is also improved.

A feature of the fifth embodiment of the invention is as follows. The metal materials of the housing, bellows, and cooling blocks are unified to the material having a coefficient of thermal expansion near that of the material of the multilayer wiring board. The alloy material having a low melting point for use in junction is the alloy of which boron and/or silicon was added to the composition of the structural material. The material of the electrical insulating layer of the cooling blocks is SiC ceramics having a high thermal conductivity. Particularly, in this case, when the coefficient of thermal expansion of the multilayer wiring board is below $5 \times 10^{-6}/°$ C., it is suitable that the metal material is unified to the Fe-Ni alloy or Fe-Ni-Co alloy.

Figure 4:
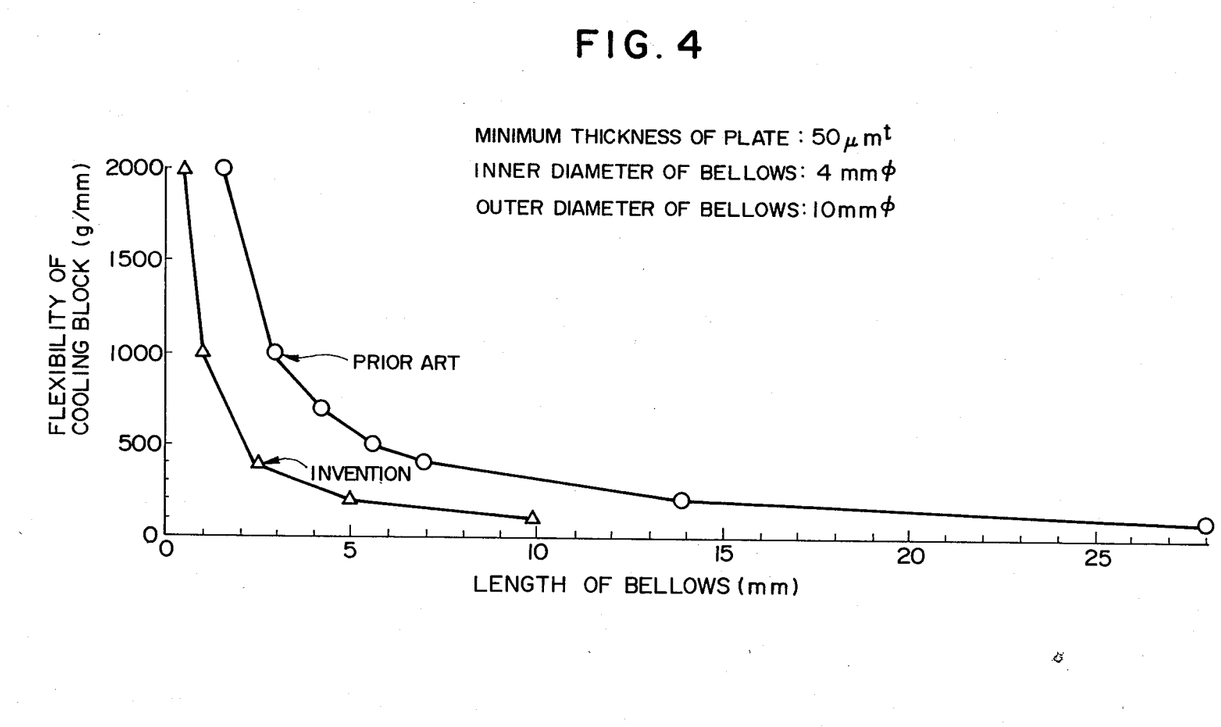
FIG. 4 is a graph showing the relation between the length of bellows and the flexibility of a cooling block.

FIG. 4 shows the result of comparison of the flexibility in the vertical direction of the cooling blocks between the cooling structure assembled using the conventional electroforming bellows and the cooling structure according to the invention. Namely, FIG. 4 is a graph showing the relation between the length (mm, an axis of abscissa) of bellows and the flexibility (g/mm, an axis of ordinate) of cooling blocks, in which marks "O" denote the data on the curve in the case of the conventional cooling structure and marks Δ represent the data on the curve in the case of the cooling structure of the invention.

As will be obvious from FIG. 4, to obtain the flexibility of 100 g/mm of cooling blocks, the bellows length needs to be set to 28 mm according to the conventional structure. On the other hand, according to the structure of the invention, it is sufficient to set the bellows length to 10 mm, so that the cooling structure can be reduced in size.

EMBODIMENT 1

FIG. 3 shows an example of the assembling process.

A photoresist film is coated onto the thin film 1 made of Kovar which is used as the bellows material and etched, thereby working the bellows rings 4, outer peripheral junction rings 3, and inner peripheral junction rings 2 from the thin film 1. In this case, as shown in process B, the respective parts are fixed to the frame 12 by the bridges 11 so as not to be separated. The sizes or layout of bellows are determined in accordance with the amounts of heat generation or arrangement of the LSI chips of the semiconductor module to be cooled. Next, the alloy of which boron (B) of 4 weight % was added to the Kovar composition is formed as the junction alloy films 5 and 6 onto both sides of the junction rings 2 and 3 so as to each have the thickness of 1 μm due to a sputtering method. On the other hand, the films consisting of $ZrO_2$ and $Y_2O_3$ of 7 weight % having the thickness of about 0.5 μm are formed as the junction preventing films 7 onto only the portions of the bellows rings which are not joined by use of the metal mask. The inner peripheral junction rings 2 are then detached from the bridges 11. The bellows parts as many as necessary number of mountains are laminated between the housing 8 and cooling blocks 9 made of Kovar with the outer peripheral junction rings 3 and bellows rings 4 fixed to the frame 12 as shown in process F. The pressure of a few to hundreds of $g/mm^2$ is applied under the vacuum ambient atmosphere and those parts are joined at temperatures above 1100° C. After completion of the joining, the bridges 11 and frame 12 coupled with the bellows parts are cut and removed and the bellows are stretched, thereby molding the assembly.

According to the embodiment, the cooling structure in which a number of bellows were connected to the housing can be assembled by one joining process and the manufacturing process is simplified. Consequently, the qualities of the junctions become constant and the reliability and productivity are improved. In addition, since the component materials are Kovar and the qualities of the junctions can be also uniform with the base material, the cooling structure having an excellent corrosion resistance can be derived. Further, the bellows produced by the method according to the embodiment have the characteristics of high flexibility as compared with the bellows produced by the conventional plating method. Therefore, when this cooling structure is actually assembled to the semiconductor module and used, the forces which are applied to the LSI chips can be reduced and the service life of the solder bump can be prolonged.

EMBODIMENT 2

Figure 5:
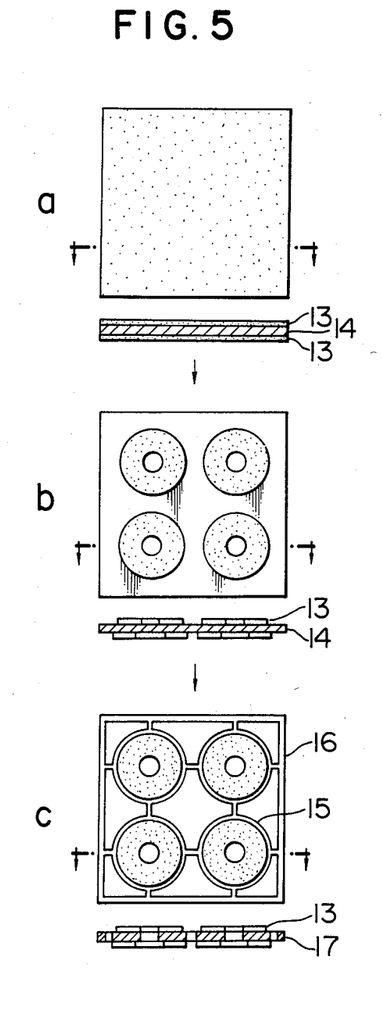
FIGS. 5 and 6 are diagrams showing a method whereby a joint preventing film is patterned and coated onto a bellows ring according to the invention.
Figure 6:
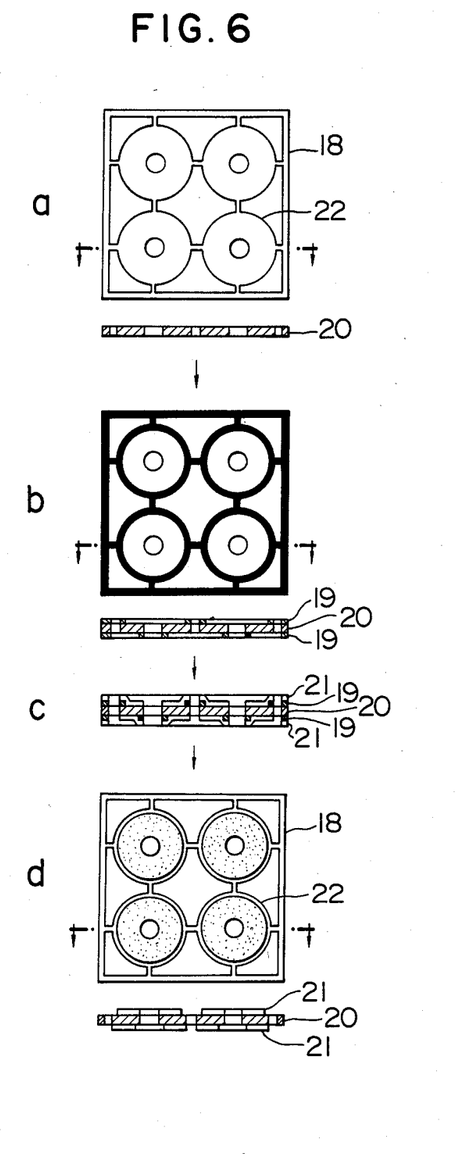

Another example of the method of manufacturing the bellows rings will be described with reference to each flow diagram of FIGS. 5 and 6. FIG. 5 shows the method whereby a dry etching is used. FIG. 6 shows the method whereby a photoresist film is used as a mask.

In FIG. 5, reference numeral 13 denotes junction preventing films; 14 a thin plate; 15 bellows rings; 16 a frame; and 17 bellows ring parts. On the other hand, in FIG. 6, reference numeral 18 denotes a frame; 19 photoresist films; 20 bellows ring parts; 21 junction preventing films; and 22 bellows rings.

In the process shown in FIG. 5, the junction preventing films 13 are first formed on the whole surfaces of both sides of the thin plate 14 as a material of bellows due to a high frequency sputtering method. Next, the necessary portions of the junction preventing films 13 are covered by the photoresist films and an ion beam is irradiated onto the whole surfaces of those films, thereby dry etching. Thereafter, the thin plate 14 is worked to the shapes of the bellows rings 15 due to a photo etching method, thereby forming the bellows parts. On the other hand, in the process shown in FIG. 6, the thin plate as the material of bellows is first worked so as to obtain the shapes of bellows rings due to a photo etching. Next, the photoresist films 19 are formed as the masks to the portions where the junction preventing films 21 are not coated. The junction preventing films 21 are formed onto the whole upper surfaces of the photoresist films 19 due to a high frequency sputtering method. Thereafter, the photoresist films are removed to obtain the bellows parts.

According to the fore going embodiments, the photo etching of the bellows rings or the patterning of the junction preventing films can be precisely performed on the order of microns using the thin film forming technology. Consequently, the cooling structure using microbellows can be precisely manufactured by the simple process.

EMBODIMENT 3

Figure 7:
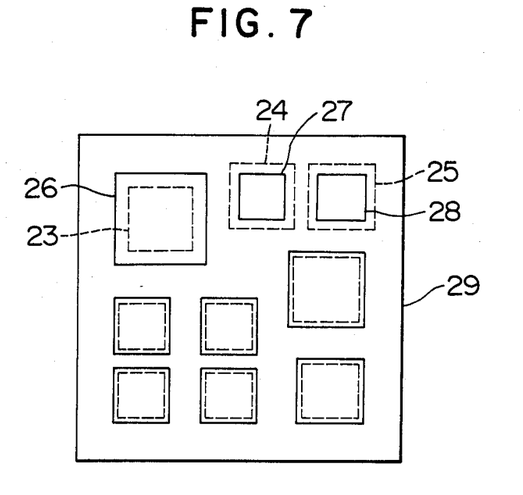
FIGS. 7 to 10 are diagrams showing examples of the modification of the shape of bellows.
Figure 8:
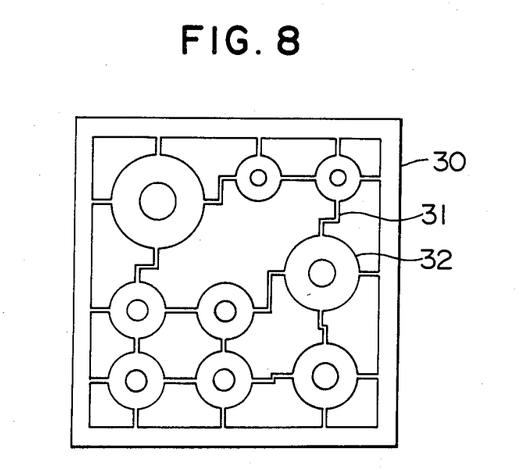

FIGS. 7 and 8 relate to a cooling structure adapted to adjust the cooling performance in which even when the sizes of LSI chips or the amounts of heat generation of the LSI chips differ as well, the temperatures of the respective LSI chips can be held to the same temperature. FIGS. 7 and 8 illustrate an embodiment of the layout and sizes of the cooling blocks in such a cooling structure and the shapes of bellows parts to assemble the cooling structure.

In FIG. 7, reference numerals 23, 24, and 25 denote LSI chips; 26, 27, and 28 represent cooling blocks; and 29 is a substrate. On the other hand, in FIG. 8, reference numeral 30 denotes a frame; 31 indicates bridges; and 32 shows bellows rings.

According to the embodiment, even in the case where the low-power LSI chips are attached onto the same substrate together with the high-power LSI chips as well, the low-power LSI chips are not excessively cooled to below their operating range and the high-power LSI chips can be sufficiently cooled within their operating range.

EMBODIMENT 4

Figure 9:
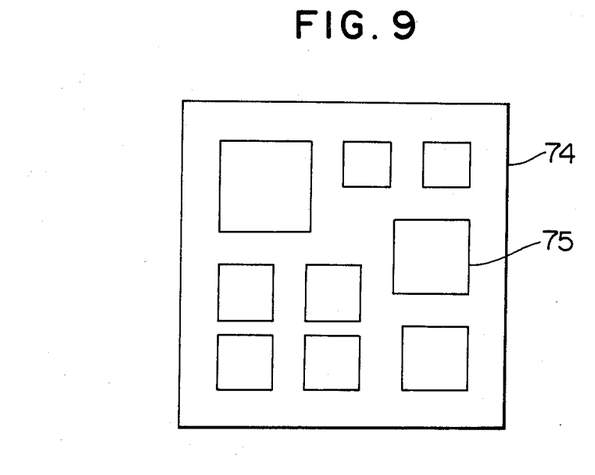
Figure 10:
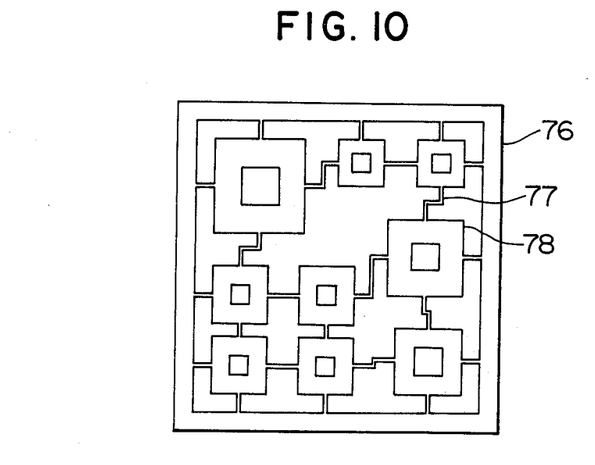

FIGS. 9 and 10 show an embodiment in the case where the circular shapes of bellows in the embodiment of FIG. 8 are replaced by square shapes. FIG. 10 shows a part plate adapted to form bellows rings. Although not shown, the shapes of junction rings are also square in accordance with the bellows rings.

In FIG. 9, reference numeral 74 denotes a substrate and 75 indicates cooling blocks. On the other hand, in FIG. 10, numeral 76 is a frame, 77 indicates bridges, and 78 represents bellows rings.

According to the embodiment, the areas of the limited spaces can be most efficiently used and the flow cross sectional areas in the bellows can be set to the maximum values, so that the cooling efficiency can be raised.

Figure 11A:
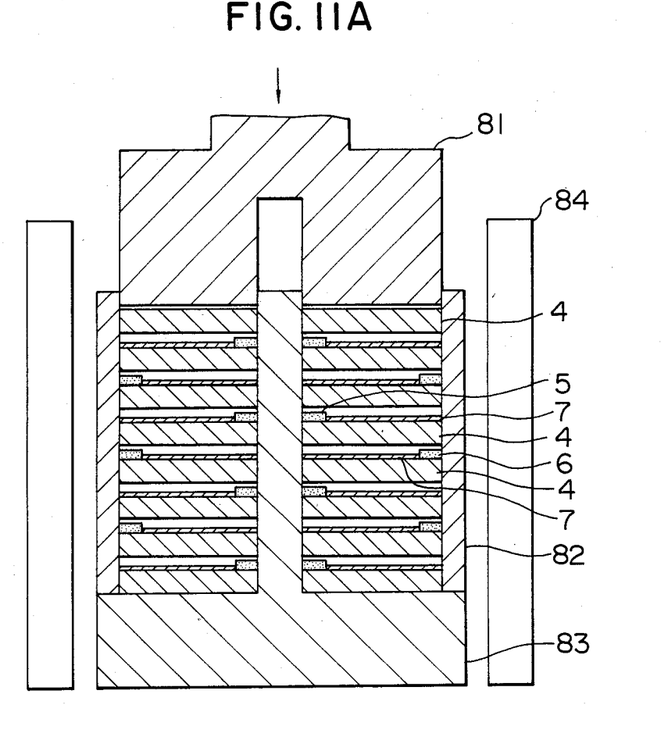
FIGS. 11A and 11B are diagrams showing a method of joining bellows rings with a pressure.
Figure 11B:
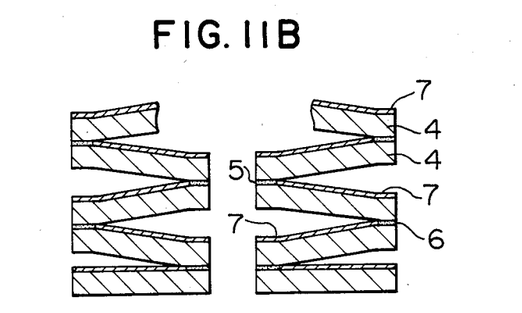

Referring now to FIG. 11A, reference numeral 81 denotes a pressure tool to press bellows rings 4 in the direction indicated by an arrow. Numerals 82 and 83 represent graphite tools and 84 denotes a heater. In this manner, after the bellows rings 4 were pressed and joined, the laminated bellows rings 4 are stretched as shown in FIG. 11B, so that the bellows rings are mutually joined formed due to the junction films 5 and 6.

EMBODIMENT 5

Figure 12:
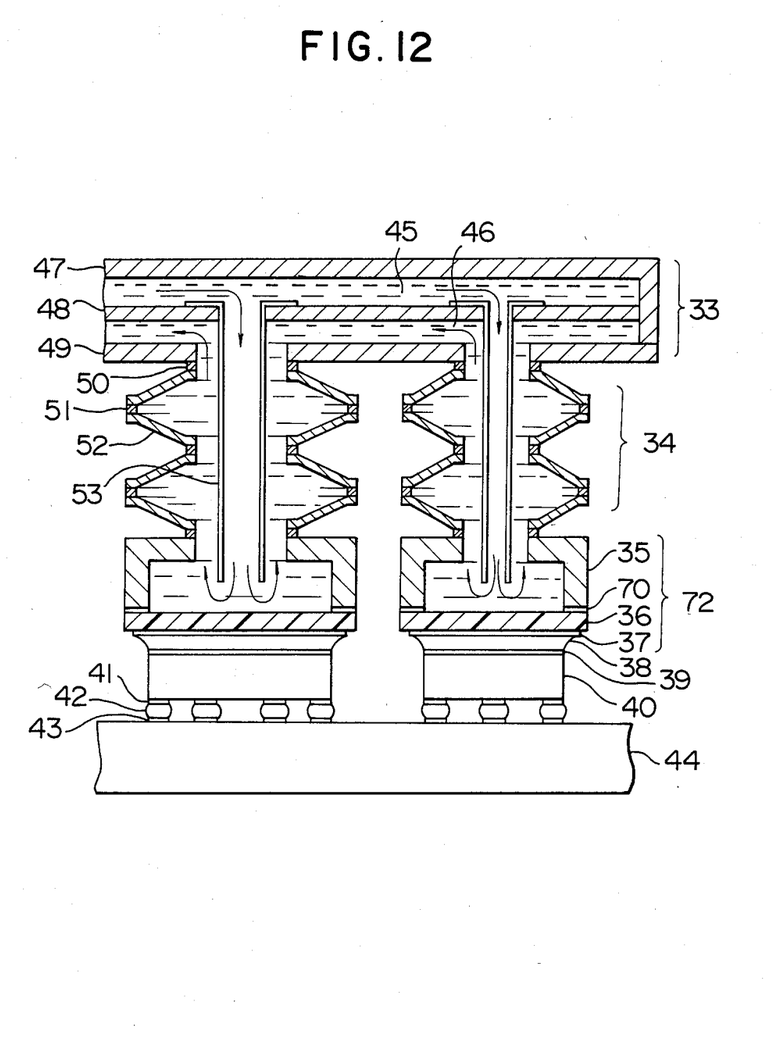
FIGS. 12 and 13 are partial cross sectional views of the assembly of which the cooling structure according to the invention was attached to the semiconductor module, respectively.

FIG. 12 shows a schematic cross sectional view of an embodiment in the case where one of the cooling structures according to the invention is installed to the semiconductor module.

In FIG. 12, reference numeral 33 denotes a housing; 34 is a bellows; 35 a cap for a cooling block; 36 an SiC ceramic; 37 and 39 metallized films; 38 a solder having a low melting point; 40 a Si chip; 41 and 43 terminals; 42 a solder consisting of Pb of 95 weight % and Sn of 5 weight %; 44 a multilayer wiring board; 45 a water feed passage; 46 a water drain passage; 47 a top plate; 48 a middle plate; 49 a bottom plate; 50 an inner peripheral junction ring; 51 an outer peripheral junction ring; 52 a bellows ring; 53 a pipe; 70 a metallized film; and 72 a cooling block.

Those component parts are assembled in the following manner. The bottom plate 49 of the housing 33, the parts 50, 51, and 52 to constitute the bellows 34, and the cap 35 for the cooling block are laminated. Junction films preliminarily formed on the junction surfaces are fused. The parts from the bottom plate of the housing to the cap are assembled. Next, the middle plate 48 to which the pipes 53 having various proper sizes are joined at predetermined positions and the top plate 47 are overlapped to form the sealed water passage, thereby hermetically joining the outer periphery of the housing. The electrical insulating material having a high thermal conductivity in which the metallized films 70 and 37 are formed onto the SiC ceramic 36 is joined to the cap 35 due to a liquid phase diffusion method. On the other hand, the Si chip 40 on which the metallized film 39 was preliminarily formed is coupled onto the multilayer wiring board 44 by use of the solder 42 consisting of Pb of 95 weight % and Sn of 5 weight %. Lastly, the cooling block 72 and Si chip 40 are metallically joined by the solder 38 of a low melting point and the assembly is completed in this manner.

According to the embodiment, the cooling medium can be led to the position near the Si chip. Also, the Si chip is connected to the cooling medium through the high thermal conductivity material. Thus, a fairly high cooling efficiency can be obtained. At the same time, since the bellows have the very flexible structure, the distortion which is caused due to the thermal expansion difference between the board and the housing can be fully absorbed and the stresses which are applied to the solder junctions 42 can be reduced. The reliability of the semiconductor module can be improved. Further, since the cooling structure has the very high corrosion resistance as mentioned in embodiment 1 of FIG. 1, the reliability of the apparatus can be also improved.

EMBODIMENT 6

Figure 13:
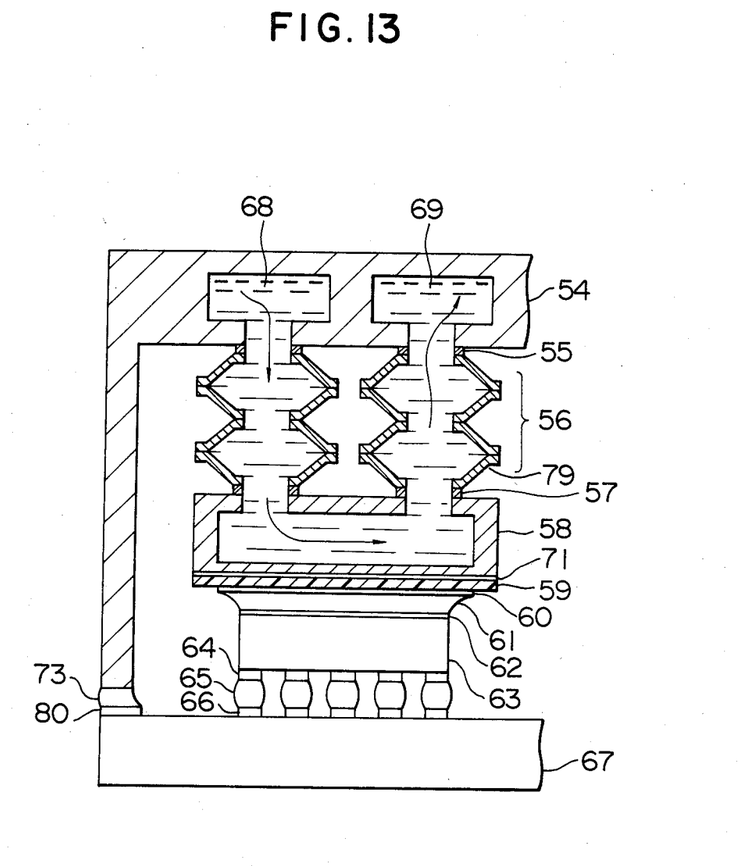

FIG. 13 shows a schematic cross sectional view of another embodiment in the case where one of the cooling structures according to the invention is installed to the semiconductor module.

In FIG. 13, reference numeral 54 denotes a housing; 55 is a junction ring; 56 a bellows; 57 a junction ring; 58 a cooling block; 59 an electrical insulating plate having a high thermal conductivity; 60 and 62 metallized films; 61 a solder having a low melting point; 63 an LSI chip; 64 and 66 terminals; 65 a solder; 67 a substrate; 68 a water feed passage; 69 a water drain passage; 71 a junction layer; 73 a solder having a low melting point; 79 a bellows ring; and 80 a metallized film.

Those component parts are assembled in the following manner. The housing 54 in which the water passages of the water feed passage 68 and water drain passage 69 are formed, the bellows rings 79 and junction rings 55 and 57 to constitute the bellows 56, and the cooling block 58 formed with inlet and outlet of the water are laminated. The junction films preliminarily formed onto the joint surfaces are fused. The parts from the housing to the cooling block are integrally joined and assembled. The junction preventing films are formed on the areas other than the junction surfaces, thereby preventing the unnecessary portions from being joined. Next, an inorganic plate 59 such as ceramics or the like having an electrical insulation property and a high thermal conductivity is joined to the bottom portion of the cooling block 58 due to a brazing or diffusion joining method. Lastly, the foregoing cooling structure is coupled to the substrate 67 onto which the LSI chip 63 was attached by use of the solders 61 and 73 each having a low melting point.

In the embodiment, the complicated cooling structure is assembled by one joining process, so that the reliability of the junction portions is improved and the manufacturing cost is reduced. In addition, with respect to the cooling efficiency and reliability of the semiconductor module or apparatus, the excellent effects similar to those in the embodiment shown in FIG. 12 can be derived.

The joint members of the materials mentioned hereinbelow can be applied to the above-mentioned embodiments: namely, titanium-nickel alloy containing nickel of 5 to 35 weight % or titanium-copper alloy containing copper of 10 to 55 weight % in the case where the thin plate 1 is made of titanium alloy; Kovar-boron alloy containing boron of 1 to 6 weight % or Kovar-silicon alloy containing silicon of 1 to 16 weight % in the case where the thin plate 1 is made of Kovar; and stainless steel-silicon alloy containing silicon of 1 to 16 weight % in the case where the thin plate 1 is made of stainless steel.

As described in detail above, according to the present invention, in the semiconductor module cooling structure in the high speed data processing apparatus such as a computer or the like, the complicated high flexible cooling structure including the bellows such that the LSI chips can be high efficiently cooled. Since no external force is applied to the LSI chips the structure can be easily assembled and manufactured at a low cost due to a lamination pressure junction. In addition, it is possible to manufacture the cooling structure in which both the material and junction portions have high corrosion resistance.

We claim:

1. A semiconductor module cooling structure comprising:
    a housing having a passage through which a cooling fluid flows:
    a cooling block to which said cooling fluid is fed from said housing and drained therefrom through independent passages and which has an electrical insulating layer at the bottom portion and is combined with a semiconductor chip through said electrical insulating layer; and
    a bellows which is connected between said housing and said cooling block, said cooling fluid being supplied to said cooling block and drained back to said housing through said bellows, and said bellows being formed in a manner such that a plurality of substantially plane ring-like metal plates are coated with thin-film ceramic in areas which are not to be joined to each other and are laminated, pressed, diffused, joined, and thereafter stretched and molded.

2. A cooling structure according to claim 1, wherein said ring-like metal plates are formed in a manner such that a thin plate is etched in accordance with a desired pattern and thereby forming said plurality of metal plates on said thin plate.

3. A cooling structure according to claim 2, wherein said desired pattern is based on an arrangement of LSI chips of the semiconductor module to be cooled.

4. A cooling structure according to claim 1, wherein alloy having a melting point lower than that of a material of said ring-like metal plates is coated as joining alloy in the areas of said metal plates to be joined, and the ceramic which is chemically and physically stable is coated in the areas of said ring-like metal plates which are not joined, and said plurality of ring-like metal plates are mutually pressed and joined.

5. A cooling structure according to claim 4, wherein said ring-like metal plates are constituted by either one of nickel, stainless steel, Fe-Ni-Co alloy, and titanium alloy.

6. A cooling structure according to claim 5, wherein in the case where said ring-like metal plates are made of Fe-Ni-Co alloy, said joining alloy is either Fe-Ni-Co-boron alloy or Fe-Ni-Co-silicon alloy.

7. A cooling structure according to claim 5, wherein in the case where said ring-like metal plates are made of stainless steel, said joining alloy is stainless steel-silicon alloy.

8. A cooling structure according to claim 5, wherein in the case where said ring-like metal plates are made of titanium alloy, said joining alloy is either titanium-nickel alloy or titanium-copper alloy.

9. A semiconductor module cooling structure comprising:
    a housing having a passage through which a cooling fluid flows;
    a cooling block to which said cooling fluid is fed from said housing and drained therefrom through independent passages and which has an electrical insulating layer at the bottom portion and is combined with a semiconductor chip through said electrical insulating layer; and
    a bellows which is connected between said housing and said cooling block, said cooling fluid being supplied to said cooling block and said cooling fluid being drained from said cooling block to said housing through said bellows, and said bellows being formed in a manner such that a plurality of substantially plane wide-ring-like thin metal plates which are coated with a ceramic film onto portions of the metal plates which are not joined and a plurality of substantially plane narrow-ring-like thin metal plates which have the same shape of said portions and coated with adjoining alloy film onto both sides are used and alternately laminated, pressed, diffused, joined, and thereafter stretched and molded.

* * * * *